US005619079A

United States Patent [19]
Wiggins et al.

[11] Patent Number: 5,619,079
[45] Date of Patent: Apr. 8, 1997

[54] EMI LINE FILTER

[75] Inventors: Charles L. Wiggins, Newport News, Va.; David W. Stewart, Bonaire, Ga.

[73] Assignee: The United States of America as represented by the Secretary of the Navy, Washington, D.C.

[21] Appl. No.: 508,872

[22] Filed: Jul. 28, 1995

[51] Int. Cl.$^6$ ............................................. H02J 1/02
[52] U.S. Cl. ........................... 307/89; 307/105; 333/12; 333/182
[58] Field of Search ................................ 307/89, 90, 91, 307/106, 108, 105; 361/111, 56; 333/12, 172, 177, 181; 379/116; 331/67; 343/841, 851, 905; 178/69; 336/83, 84

[56] References Cited

U.S. PATENT DOCUMENTS

| | | | |
|---|---|---|---|
| 3,681,612 | 8/1972 | Vogl et al. | 307/105 |
| 4,342,013 | 7/1982 | Kallman | 333/181 |
| 4,622,526 | 11/1986 | Schneider | 333/181 |
| 4,760,356 | 7/1988 | Kempster | 333/181 |
| 5,083,101 | 1/1992 | Frederick | 333/12 |
| 5,119,266 | 6/1992 | Petry | 361/111 |
| 5,136,455 | 8/1992 | Billingsley | 361/111 |
| 5,179,362 | 1/1993 | Okochi | 333/12 |

*Primary Examiner*—William M. Shoop, Jr.
*Assistant Examiner*—Peter Ganjoo
*Attorney, Agent, or Firm*—Michael J. McGowan; Prithvi C. Lall; Michael F. Oglo

[57] ABSTRACT

A filter circuit for reducing electromagnetic interference in an ungrounded three-phase delta electrical system. The filter circuit includes a low-pass filter associated with each power phase having one input and output terminal placing an inductor in series with a phase conductor from a power supply. Input and output capacitors connect to a second input and output terminals respectively. An inductor connects in common between the second input and second output terminals thereby to complete a loop that is isolated from ground. Voltage suppression circuits connect from each phase to ground on the input side of the filter.

18 Claims, 5 Drawing Sheets

EMI LINE FILTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention generally relates to filters for electromagnetic interference and more particularly to filters for minimizing electromagnetic interference in ungrounded three-phase power systems.

(2) Description of the Prior Art

It is well known that electromagnetic interference (EMI) can have an adverse impact on the operations of electronic equipment. Typically switching actions on loads supplied from a power supply generate transients that produce the interference that is either radiated through space or conducted through power lines to the equipment. The problem is exacerbated when there is also a potential ground loop path for currents generated by such transients.

Moreover, the problem is frequency dependent. Although EMI can be present in conventional 60 Hz electrical systems, the problem intensifies at higher frequencies. For example, there are a number of applications where weight and size have been determining criteria for the selection of higher frequency power supply. Aircraft and ships are examples where, for purposes of size and weight, 400 Hz power supplies, rather than 60 Hz power supplies, are used frequently. Such power supplies can include motor generator sets or frequency changers that supply three-phase power through ungrounded delta- or wye- transformer connections. In these systems the production of non-linearities in the generated wave form can constitute still another source of EMI. Further, in shipboard and aircraft applications, metal generally surrounds the power system and related equipment and the metal can constitute a current path whereby any interference produces undesirable ground loop currents.

A number of approaches including the use of input and bypass filters have attempted to minimize the generation of this EMI and to isolate equipment from the effects of that interference. For example, U.S. Pat. No. 5,179,362 to P. L. Okochi et al. depicts a power line filter that attenuates normal mode noise between the power lines and common mode noise appearing between the power line and the ground line. The line filter includes a plurality of first inductors interposed between the live line and the neutral line, a first X-capacitor interposed between the live line and the neutral line on the load side relative to the first inductors, a plurality of second inductors interposed between the live line and the neutral on the load side relative to the first X-capacitor, and a Y-capacitor interposed between the live line and the ground line as well as between the neutral line and the ground line on the load side relative to the second inductors, the Y-capacitor constituting a common mode filter between the first inductors and the second inductors in response to common mode noise. The X-capacitor is connected directly between the live and neutral lines; the Y-capacitor comprises two capacitors in series between the live and neutral lines with a common point connected to ground.

U.S. Pat. No. 5,119,266 to Petry discloses an EMI filter protection circuit for use with an EMI filter in a three-phase power circuit that includes three capacitors coupled to the output terminals of the filter. The EMI filter and power circuit have a resonant frequency which is substantially equal to the line frequency. The capacitors of the protection circuit have values that are selected to change the resonant frequency of the EMI filter and power circuit such that the resonant frequency is not substantially equal to the line frequency. Essentially these capacitors are added in parallel to each leg of a three-phase delta transformer.

U.S. Pat. No. 5,083,101 to Frederick discloses an EMI filter including an inductor assembly for attenuating both common mode and differential mode interference. The inductor assembly includes an outer core of permeable material defining an outer window and an inner core of permeable material disposed in the outer window and defining an inner window. A first power lead for connecting the equipment to a source of electrical power includes a portion wound in one direction about only the outer core. The inductor assembly includes a second power lead for connecting the equipment to the source of electrical power with a portion of the second lead wound about both the outer and inner cores in the opposite direction to the winding of the portion of the first power lead. The outer core provides a magnetic path for the attenuation of common mode emissions and the inner core provides a magnetic path for the attenuation of differential mode noise. The filter can also include a multiple function capacitor including three capacitive elements.

U.S. Pat. No. 4,622,526 to Schneider et al. discloses a similar power line filter using a pair of inductors. In the Schneider et al. patent a printed circuit board has an extended grounding area to which are connected parallel capacitors, a pair of line inductors and a parallel resistor. Each inductor is formed as a multi-section coil wound on a plastic bobbin and two wound inductors are connected on rectangular cores to form line inductors. At least two of the capacitors are rectangularly shaped and are mounted on opposite ends of the line inductors. Electrically this circuit places an input capacitor and resistor across the input of the power lines, inductors in series with each line in an output capacitive network, much like the Frederick patent.

Another similar structure is shown in U.S. Pat. No. 4,342,013 to Kallman with capacitive input and output networks and inductors in series with each line. The filtering is accomplished by providing a distributive capacitance that is electrically connected between the power lines and the ground wire of a power distribution system. In addition to lumped parameter or fixed value capacitors, a distributive capacitance is provided by use of a printed circuit board upon which the electrical components forming the filter are mounted. A specially formed dual inductor is wound a common-core inductor using two toroidal cores preferably formed of ferrite each having a different permeability versus frequency curve. The filter is intended for use in three-phase Y-connected power distribution systems as well as conventional single-phase systems.

Filtering has been suggested through close coupling as shown in U.S. Pat. No. 4,760,356 to Kempster that discloses the power line filter having at least an inductive element and a capacitive element and a circuit network with a coil therein coupled to the inductive element. The circuit network includes a capacitive element and resistive element parallel connected and in parallel with a serially connected inductive element and coil. The coil is closely coupled with the inductive element of the power line filter.

In addition, and as described in more detail later, attempts to reduce EMI power supplies have included the use of bypass capacitors in the front end of the power supply that connect to electrical ground. Even when such filters are included in a power system, the levels of EMI can still exceed those which are acceptable.

SUMMARY OF THE INVENTION

Therefore it is an object of this invention to provide an improved filter for minimizing electromagnetic interference caused by ground loop currents in an ungrounded delta three-phase power system.

Another object of this invention is to protect electronic equipment from input transients.

Still another object of this invention is to provide a filter which minimizes equipment generated transients from migrating to the input power supply.

In accordance with one aspect of this invention, an electromagnetic interference reducing circuitry for interconnecting phase conductors from an ungrounded delta multiple phase power supply and from an ungrounded delta multiple phase electrical load includes a plurality of 4-terminal low-pass filters. Each low pass filter has a first input terminal that connects to a given phase conductor from the electrical supply and a second input terminal that is electrically coupled to the first input terminal. A first output terminal connects to a corresponding phase conductor from the electrical load; and a second output terminal is electrically coupled to the first output terminal. The second input terminal and second output terminal are isolated from the electrical load and the electrical supply, respectively. An inductive reactance has a first terminal connected to all of the second input terminals for all the low pass filters and a second terminal connected to all the second output terminals of all the filters.

In accordance for another aspect of this invention, an electromagnetic interference reducing circuit for a three-phase ungrounded delta power system includes a three-phase power supply with three-phase power connections, an electrical load with three-phase power connections and electrical ground interconnects the power supply and electrical load and includes first, second and third inductors interposed respectively between said first, second and third phase connections of the power supply and output terminals. A fourth inductor comprises first and second terminals. First, second and third input impedances connect respectively to each of the input terminals of the first, second and third inductors and in common to the first terminal of said fourth inductor, each impedance including a capacitor and resistor in parallel. First, second and third output capacitors connect respectively to each of the output terminals of the first, second and third inductors and in common to the second terminal of said fourth inductor. First, second and third voltage suppressors have a first connection to a corresponding one of the first, second and third inductor input terminals and a second connection to the ground connection. Each voltage suppressor includes an over voltage line protector and a line transient voltage suppressor in parallel.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF THE PREFERRED EMBODIMENT

Figure 1:
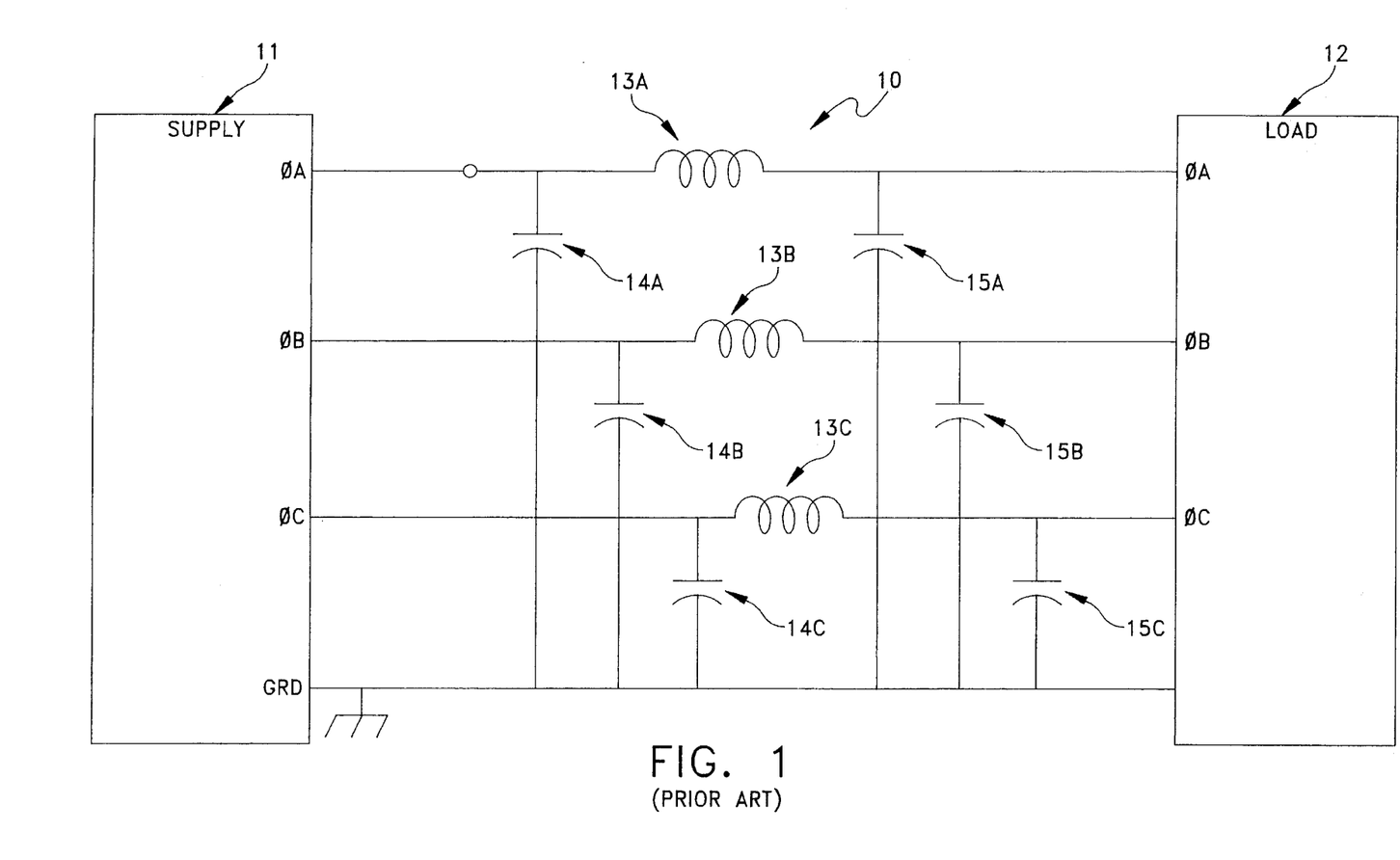
FIG. 1 depicts a prior art line-to-ground filtering system that is useful in understanding this invention.

FIG. 1 depicts a prior art electrical system 10 comprising a three-phase supply 11 and a three-phase load 12 connected in an ungrounded delta configuration. FIG. 1 also depicts, in a lumped constant form, a typical prior art filter utilized in many applications that comprises a low pass filter connected in each phase and to ground. More specifically, Phase A ($\phi$A) includes a series inductor 13A; input and output capacitors 14A and 15A connect from each side of the inductor 13A to ground. Similar filter networks include inductors 13B and capacitors 14B and 15B in Phase B ($\phi$B) and inductors 13C and capacitors 14C and 15C in Phase C ($\phi$C).

Figure 2:
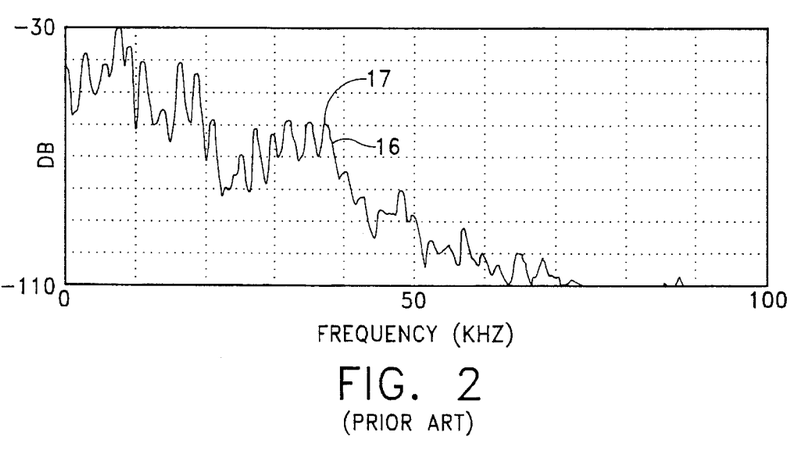
FIG. 2 depicts the spectrum and amplitude of interference resulting in a circuit such as shown in FIG. 1.

Graph 16 in FIG. 2 represents expected electromagnetic interference (EMI) in terms of the frequency spectrum of induced ground loop currents in such an environment with 400 Hz supply and with filters of the type shown in FIG. 1 in which each of the capacitors has a value of 1.2 $\mu$F each of the inductors has a value of 22 $\mu$H. As will be apparent, there is significant interference in the frequency range up to 50 Khz in FIG. 2. Moreover the level remains above a maximum acceptable level. Typically the prior art filters shown FIG. 1 operate with a common mode rejection frequency of about 31 Khz which corresponds to the rapid rolloff and the frequencies beginning at point 17 in FIG. 2. Even with this rolloff, a significant amount of interference energy exists in the frequency range between 0 and 50 Khz.

Figure 3:
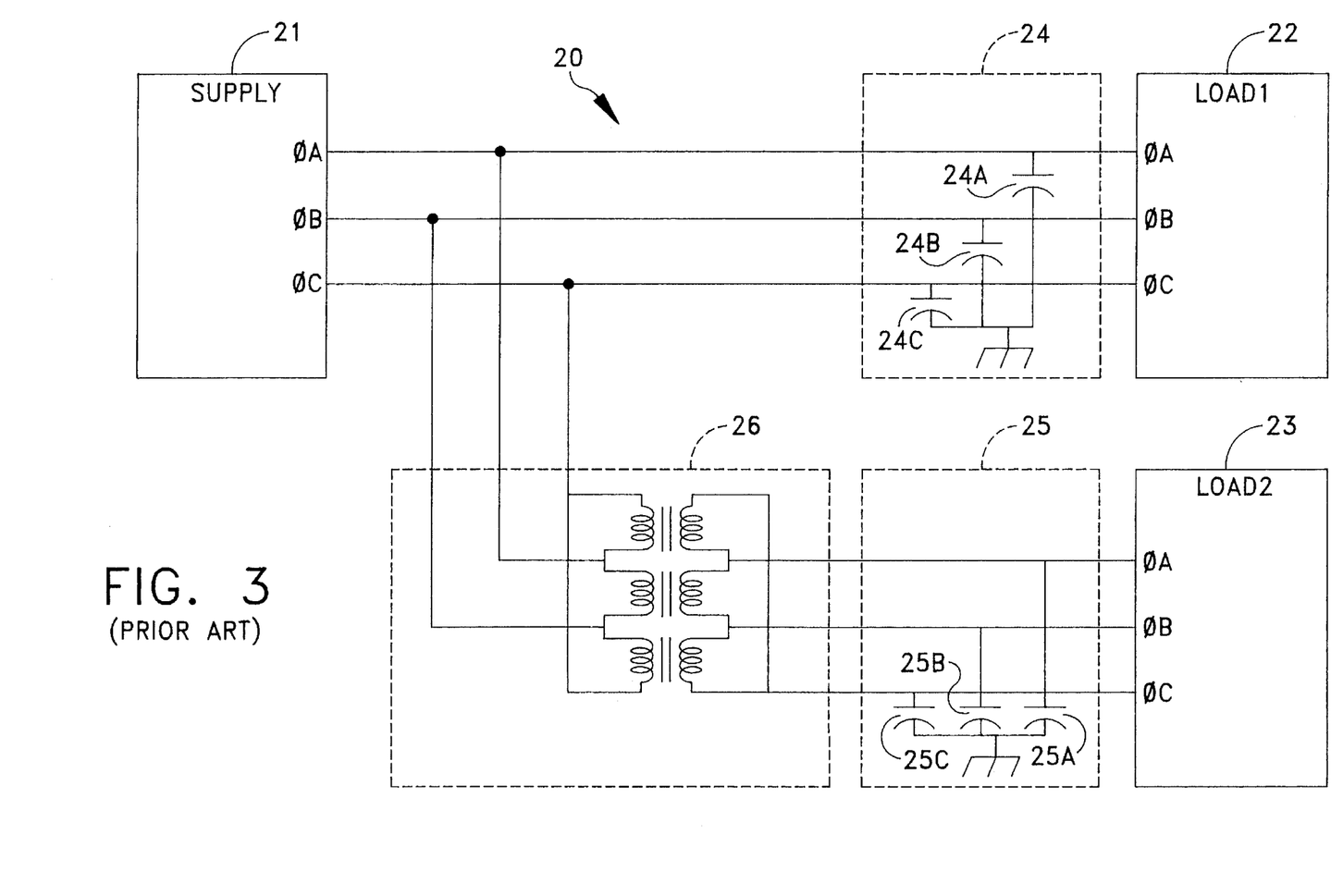
FIG. 3 depicts a prior art system circuit using isolation transformers.

FIG. 3 depicts another prior art approach to minimizing the affects of EMI. In FIG. 3 an electrical system 20 comprises a 400 Hz three-phase supply 21, a first three-phase load 22 and a second three-phase load 23. A capacitive network or line filter 24 comprises three capacitors 24A, 24B and 24C for bypassing high frequency current to ground from each of the corresponding $\phi$A, $\phi$B and $\phi$C conductors. A similar network or line filter 25 comprising capacitors 25A, 25B and 25C provides a bypass function for the second load 23. In this particular system a three-phase delta-delta power isolation transformer 26 isolates the second load 23 from both the supply 21 and the first load 22. In this configuration the isolation transformer acts as a high impedance to any current in a structure current loop including the ground. That is, the use of such an isolation transformer constitutes another way to break up a current loop by imposing a very high impedance to the ground loop current.

Figure 4:
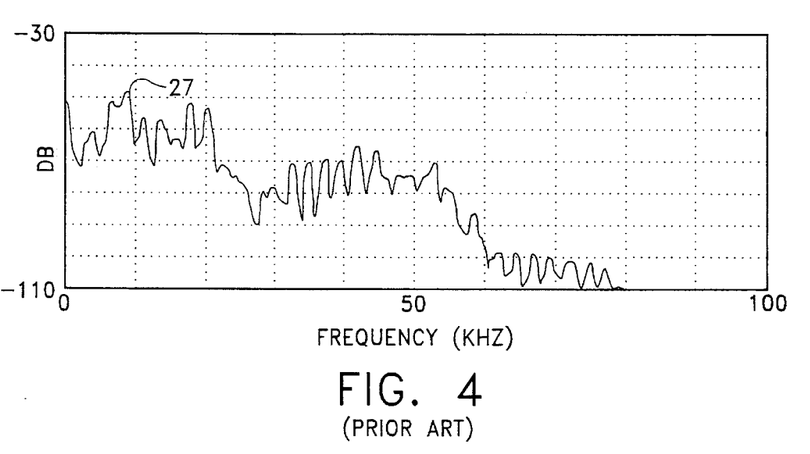
FIG. 4 depicts the results in a prior art circuit that uses isolation transformers.

Graph 27 in FIG. 4 depicts the frequency spectrum of the expected induced ground loop currents of the circuit of FIG. 3. Although the addition of isolation transformer 26 provides some improvement, the resonant frequency of the system also increases so the rolloff frequency increases. Low order power line harmonics that are well within the passband of the EMI filter continue to produce ground loop currents well above the acceptable maximum level. The configuration of the capacitors to ground provides only common mode noise rejection; there can be no differential mode noise in the cores of the single inductors. Each filter exhibits a high capacitance to ground that is far in excess of certain specifications for the maximum capacitance. This contributes to high leakage current and provides a low impedance path for higher frequency noise currents. For example, the filter shown in FIG. 3 produces a ground current at 400 Hz in the order of 377 milliamperes.

Even when a three-phase system is reasonably balanced, excessive ground currents can exist. Balancing does provide a low leakage current due to the loads at a fundamental frequency. However, imbalances in the load can exist at harmonic frequencies. In the particular environment of FIG. 1, the noise currents to ground were in the order of 520 milliamps, greatly in excess of a 5 milliamp maximum acceptable current level.

Figure 5:
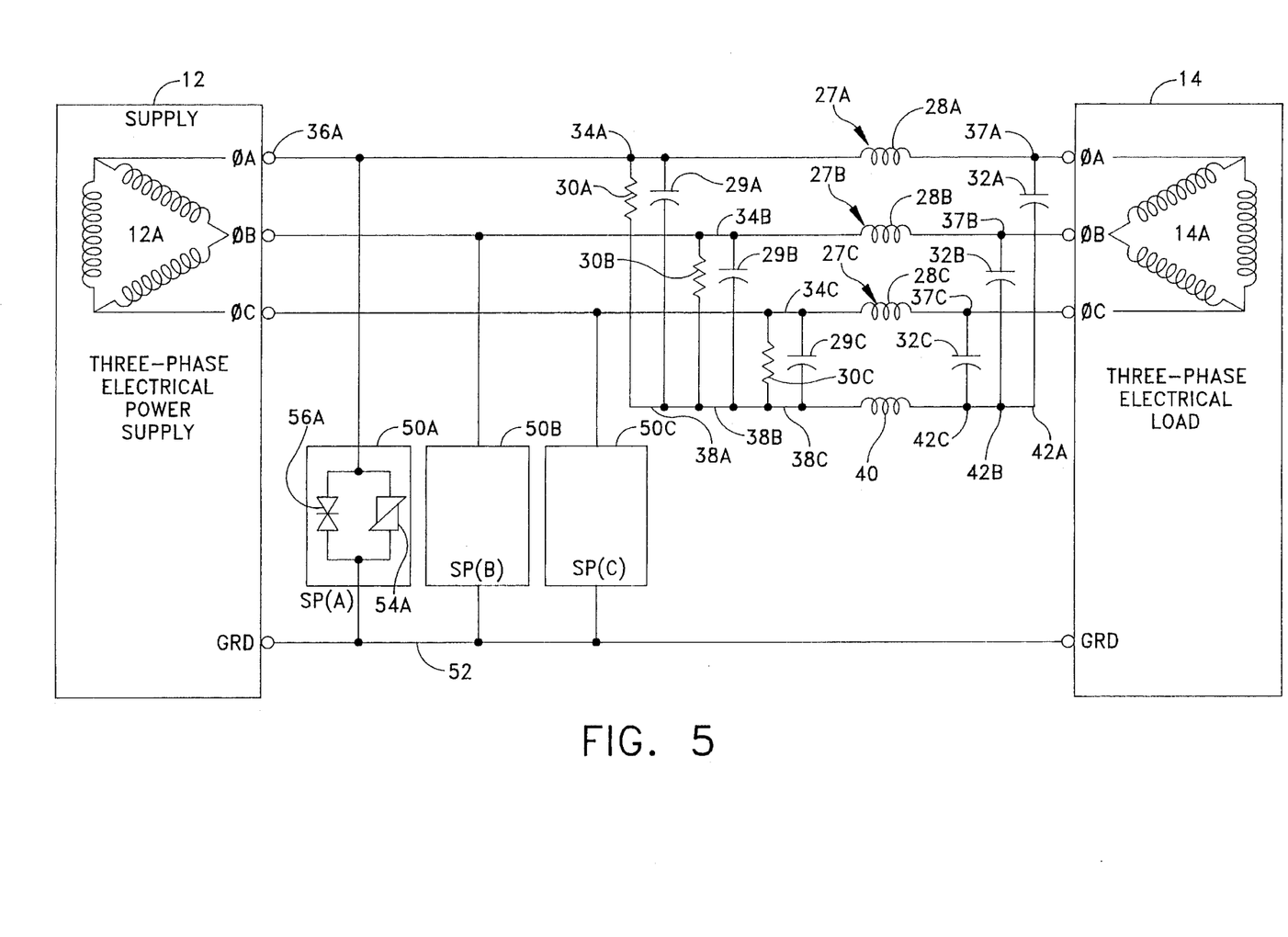
FIG. 5 is a schematic diagram of a filter that incorporates this invention.

The filter shown in FIG. 5 eliminates a line-to-ground capacitive current path, provides over-voltage line protection, provides line transient voltage suppression and complies with power line-to-ground currents requirements established in the strictest standards. The circuit will be discussed as being connected between the ungrounded electrical power supply 12 having a three-phase delta connected source 12A and an ungrounded electrical load 14 having a three-phase delta connected load 14A. That is, both the electrical power supply source 12A and the electrical load 14A are isolated from a ground that could form a structure current loop.

Still referring to FIG. 5 a plurality of four-terminal low-pass filters connect the electrical supply 12 and the electrical load 14. In the following discussion corresponding reference numerals identify corresponding elements, with suffix letters "A, B" and "C referring to phases "A", "B" and "C". A first formed terminal low pass filter 27A comprises an inductor 28A, an input capacitor 29A input a parallel resistor 30A, and an output capacitor 32A. A first input terminal 34A formed by the junction of the inductor 28A, input capacitor 29A and resistor 30A connects to the φA phase conductor 36A from the electrical power supply 12. A first output terminal 37A formed by the junction of the inductor 28A and output capacitor 32A connects to the corresponding φB phase conductor at the electrical load 14. A second input terminal 38A, formed by a second junction of the input capacitor 29A and parallel input resistor 30A, connects to one side of an inductor 40 while a second output terminal 42A, formed by the output capacitor 32A, connects to the other side of the inductor 40.

A filter 27B includes an inductor 28B in line between the φC terminals at the ungrounded three-phase delta electrical power supply 12 and electrical load 14. This filter has an input capacitor 29B and resistor 30B in parallel that form a first terminal 34B for connection to the power supply 12 and a second terminal 38B for connection with the first input terminal 38A of the inductor 40. Likewise an output capacitor 32B forms a first terminal 37B with the inductor 28B that connects to the three-phase electrical load φB phase conductor and a second terminal 42B that connects to the output of the inductor 40.

Similarly the filter 27C includes an inductor 28C, an input capacitor 29C and resistor 30C in parallel that form a first terminal 34C with the one side of the inductor 26C that connects to the power supply 12 and a second terminal 38C for connection with the other second input terminals 38A and 38B the inductor 40. An output capacitor 32C forms a terminal 38C that connects to the output side of the inductor 27C and the electrical load 14 and a second terminal 42C that, with the second output terminals 42A and 42B, connects to the inductor 40.

Thus the inductor 40 constitutes an inductive reactance having a first or input terminal connected to all the second input terminals 38A, 38B and 38C that are isolated from the ground and a second or output terminal connected to all the second output terminals 42A, 42B and 42C that also are isolated from the ground.

To further minimize interference, the circuit shown in FIG. 5 includes suppression circuits 50A, 50B and 50C that connect from the phase conductors "φA", "φB" and "φC" respectively to ground 52. Each suppression circuit has the same construction. Suppression circuit 50A, for example, includes a varistor 54A and a transorb transient voltage suppressor 56A. Corresponding components connected in parallel are located in each of the other suppression circuits 50B and 50C. The varistors provide over voltage line protection while the transorb voltage suppressors provide line transient voltage suppression.

The inductive reactance provided by the inductor 40 works with the components in each of the filters 27A, 27B and 27C to provide harmonic filtering and cancellation. As all the harmonics from these filters must pass through the inductor 40, they are in essence canceled so the differential mode current is theoretically zero since each current component is out of phase with each of the others by 120° in an absolute sense. As there are no filtering capacitors connected between the power conductors and ground, there is no common mode current.

In one particular embodiment, the input and output capacitors have a value of 2 μF, the input resistors 100 kohm, the varistors are rated for 130 Vrms, 20 Joules, and the transorb transient voltage suppressors are rated at 130 Vrms, 1500 Watts. Each of the inductors 27A, 27B, 27C and 40 has a value of 27 μH. The resonant frequency of each of these filters is approximately 21.7 Khz that is significantly lower than the resonant frequency for common mode rejection in the prior art filter of FIGS. 1 and 3. Moreover, the substitution of the filter in FIG. 5 for the filters in FIGS. 1 and 3 has a minimal effect on the power factor and may, in fact, improve the power factor. The circuit in FIG. 5, compared to conventional circuits without filters and filters constructed in accordance with FIG. 1 shows the following improvements in performance:

| POWER SUPPLY | TOTAL GROUND CURRENT FILTER CONFIGURATION | |
| --- | --- | --- |
| | OLD FILTER (LINE-TO-GROUND) FIG. 1 | NEW FILTER (LINE-TO-LINE) FIG. 5 |
| a) Old Power Supply | 90.0 mA (23 mA)* | 9.40 mA |
| b) Modified Power Supply (i.e., feed-through caps removed) | 56.4 mA (.26 ma)* Total ground current with old filter isolated from chasis to produce line-to-line configuration | 0.09 mA |

From the foregoing table it will be apparent that the circuit of FIG. 5 decreases total ground currents significantly over the ground currents characteristic of the circuit in FIG. 1. The current values marked with an asterisk represent the total ground circuit with the old filter isolated from the chassis to produce a line-to-line configuration.

Figure 6:
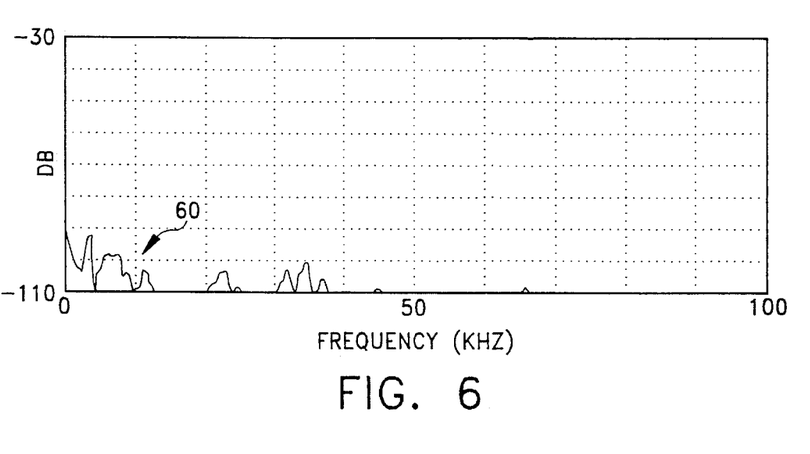
FIG. 6 depicts the spectrum and amplitude of the same system that produces the results of FIGS. 2 and 4 by substituting the circuitry of FIG. 5.

FIG. 6, particularly when compared with FIGS. 2 and 4 demonstrates that the substitution of the filter in FIG. 5 produces a dramatic improvement in the content of harmonic noise below the cut off frequency as represented by graph 60 in FIG. 6. In one particular example, it was predicted that the noise with a new filter would be reduced by 62 db. This compares with an approximate 18 db reduction provided when an isolation transformer is substituted as in FIG. 3.

Figure 7:
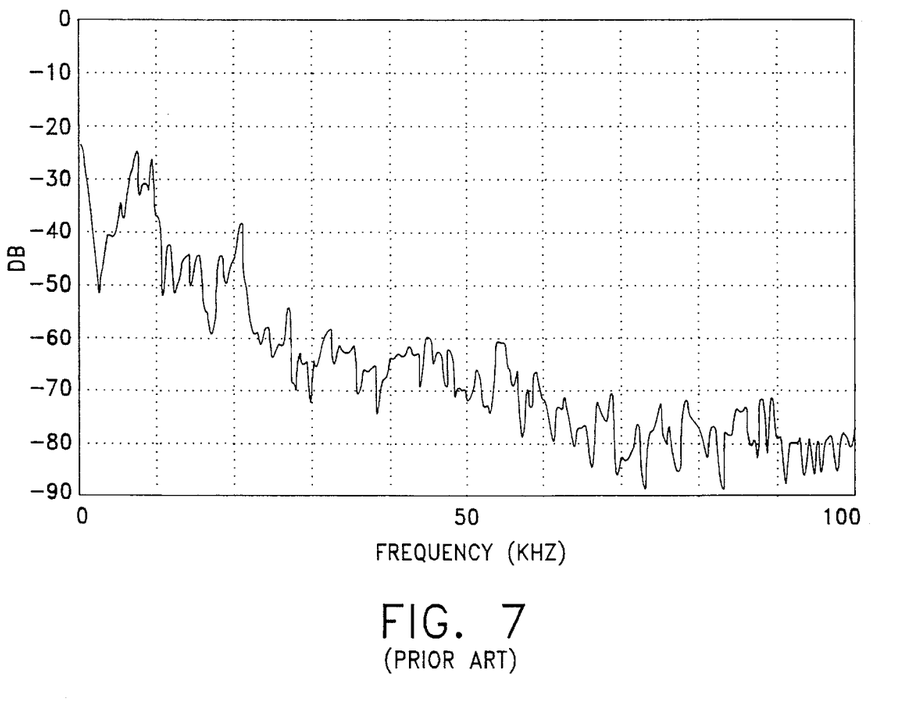
FIG. 7 is an analysis of interference in an actual environment utilizing a prior art filter.
Figure 8:
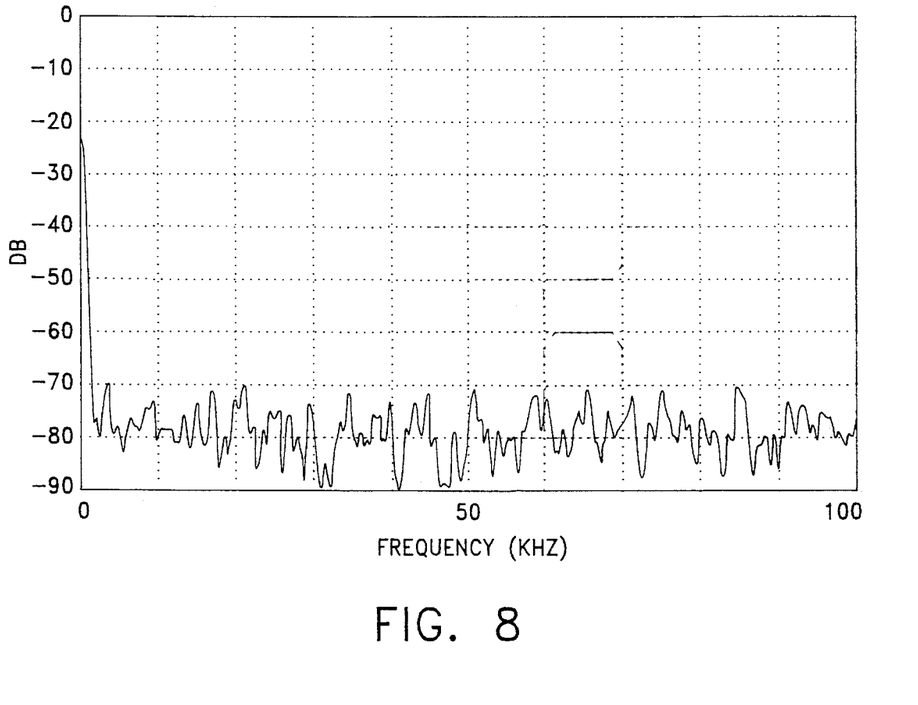
FIG. 8 is an analysis of the interference on the tests in the actual environment of FIG. 7 in which the prior art filter is replaced with a filter constructed in accordance with FIG. 5.

FIGS. 7 and 8 depict an improvement in the level of noise on an ungrounded three-phase delta 400 Hz power supply based upon actual measurements FIG. 7 presents measurements with prior art line filters in FIG. 7 and in FIG. 8, with the filter constructed in accordance with FIG. 5. There is a marked improvement in interference below the cut off frequency constituted by a reduction of 60 db to 70 db in the range up to 10 khz. Moreover the level of interference is well below the accepted maximum level.

Therefore it will be apparent from the foregoing discussion and the comparative results particularly in FIGS. 2, 4, 6, 7 and 8, that the addition of the filter shown in FIG. 5 produces a marked reduction in the EMI level associated with a 400 Hz power supply. This improvement is achieved by a filter comprising an inductor in each phase between a power supply and load that forms part of a four terminal low-pass filter. Input and output bypass capacitors connect from each inductor in common across a common inductor to form a loop that is isolated from ground. The specifically disclosed embodiment incorporates circuit components for a particular frequency and voltage power supply. It will be apparent that other components could be substituted to accommodate the operation of any filter constructed in accordance with this invention to other operating environments. Thus, although this invention has been disclosed in terms of certain embodiments, it will be apparent that many modifications can be made to the disclosed apparatus without departing from the invention. Therefore, it is the intent of the appended claims the cover all such variations and modifications as come within the true spirit and scope of this invention.

What is claimed is:

1. A filter circuit for reducing electromagnetic interference in an electrical system including a multiple-phase power supply and a multiple phase electrical load, each of which is isolated from a ground, said filter circuit comprising:

a plurality of four-terminal low-pass filters for connection between the electrical supply and the electrical load, each said low-pass filter having first and second input terminals and first and second output terminals, said first input terminal being for connection to a given phase conductor from the electrical supply, the second input terminal being electrically coupled to said first input terminal, said first output terminal being for connection to a corresponding phase conductor from the electrical load and said second output terminal being electrically coupled to said first output terminal, said second input terminal and said second output terminal of each of said low-pass filters being isolated from ground; and a two-terminal inductive reactance having a first terminal connected to all said second input terminals and a second terminal connected to all of said second output terminals.

2. A filter circuit as recited in claim 1 wherein each of said low-pass filters comprises:

a inductor in series between said first input terminal and said first output terminal;

an input capacitive impedance connected between said first and second input terminals; and an output capacitive impedance connected between said first and second output terminals.

3. A filter circuit as recited in claim 2 wherein said input capacitive impedance in each said low-pass filter comprises a resistor and capacitor in parallel.

4. A filter circuit as recited in claim 2 wherein said output capacitive impedance in each said low-pass filter comprises a capacitor.

5. A filter circuit as recited in claim 1 additionally comprising means for suppressing electrical transients connected to each of said first input terminals.

6. A filter circuit as recited in claim 1 wherein the electrical power supply and load operate with respect to an electrical ground and said apparatus additionally comprises means for suppressing electrical transients connected between each of said first input terminals and electrical ground.

7. A filter circuit as recited in claim 6 wherein each of said suppression means includes a line transient voltage suppressor.

8. A filter circuit as recited in claim 6 wherein each of said suppression means includes an over-voltage line protector.

9. A filter circuit as recited in claim 6 wherein each said suppression means includes an over-voltage line protector and a line transient voltage suppressor in parallel between a corresponding phase conductor and ground.

10. In a three-phase power system for operating in an environment with a ground in which the three-phase power system includes an ungrounded three-phase delta power supply with three phase power connections and an electrical load with ungrounded three-phase delta power connections, the improvement of a filter circuit for reducing electromagnetic interference comprising:

first, second and third low-pass filters, each having first input terminals for connection to each of the power supply phase connections, second input terminals being electrically coupled to said first input terminals, first output terminals for connection to each of the electrical load phase connections and second output terminals being electrically coupled to said first output terminals, said second input terminal and said second output terminal being isolated from the ground; and a two-terminal inductance having a first inductor terminal connected to all said second input terminals and a second inductor terminal connected to all said second output terminals.

11. A filter circuit as recited in claim 10 wherein each of said low-pass filter means comprises:

inductor means connected in series between said first input terminal and said first output terminal;

input capacitive impedance means connected between said first and second input terminals; and output capacitive impedance means connected between said first and second output terminals.

12. A filter circuit as recited in claim 11 wherein each said input capacitive impedance means comprises a resistor and capacitor in parallel.

13. A filter circuit as recited in claim 11 wherein each of said output capacitive impedance means comprises a capacitor.

14. A filter circuit as recited in claim 11 additionally comprising suppression means connected between each said first input terminals and ground for suppressing electrical transients.

15. A filter circuit as recited in claim 14 wherein each of said suppression means includes a line transient voltage suppressor.

16. A filter circuit as recited in claim 14 wherein each of said suppression means includes an over voltage line protector.

17. A filter circuit as recited in claim 14 wherein each said suppression means includes an over voltage line protector and a line transient voltage suppressor in parallel.

18. In a three-phase power system for operating in an environment with a ground in which the three-phase power system includes a three-phase power supply with three ungrounded phase connections in a delta configuration and an electrical load with three ungrounded phase connections in a delta configuration, the improvement of an electromagnetic interference reducing filter circuit for interconnecting the power supply and the electrical load comprising:

first, second and third inductors having input terminals for connection, respectively, to each of the first, second and third phase connections of the power supply and output terminals for connection, respectively, to the corresponding first, second and third phase connections of the electrical load;

a fourth inductor having first and second terminals, said first and second terminals being isolated from ground;

first, second and third input impedance means connected, respectively, to each of said input terminals of said first, second and third inductors and in common to the first terminal of said fourth inductor, each of said impedance means including a capacitor and resistor in parallel;

first, second and third output capacitors connected, respectively, to each of said output terminals of said first, second and third inductors and in common to the second terminal of said fourth inductor; and first, second and third voltage suppression means for suppressing voltage transients, each of said suppression means having a first connection to a corresponding one of said first, second and third inductor input terminals and having a second connection to ground, each of said voltage suppression means comprising an over voltage line protector and a line transient voltage suppressor in parallel.

* * * * *